(12) United States Patent
Hong et al.

(10) Patent No.: US 11,088,210 B2
(45) Date of Patent: Aug. 10, 2021

(54) DISPLAY DEVICE INCLUDING A FIRST PIXEL, A SECOND PIXEL AND A THIRD PIXEL AT LEAST PARTIALLY SEPARATED FROM EACH OF THE FIRST PIXEL AND THE SECOND PIXEL

(71) Applicant: Samsung Display Co., Ltd., Yongin-Si (KR)

(72) Inventors: Sangmin Hong, Cheonan-si (KR); Heeseong Jeong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/397,251

(22) Filed: Apr. 29, 2019

(65) Prior Publication Data

US 2020/0006445 A1 Jan. 2, 2020

(30) Foreign Application Priority Data

Jun. 27, 2018 (KR) .................. 10-2018-0073866

(51) Int. Cl.
*H01L 29/20* (2006.01)
*H01L 33/00* (2010.01)
*H01L 27/32* (2006.01)
*H01L 51/50* (2006.01)

(52) U.S. Cl.
CPC ...... *H01L 27/3218* (2013.01); *H01L 27/3216* (2013.01); *H01L 27/3246* (2013.01); *H01L 51/5056* (2013.01); *H01L 51/5072* (2013.01)

(58) Field of Classification Search
CPC .......... H01L 27/3211; H01L 51/5225; H01L 27/3276; H01L 27/3258; H01L 51/5203; H01L 27/3218; H01L 27/3216; H01L 51/5072; H01L 51/5056; H01L 27/3246; H01L 27/326; H05B 33/26; G09G 3/3208
See application file for complete search history.

(56) References Cited

U.S. PATENT DOCUMENTS

| | | | |
|---|---|---|---|
| 8,698,395 B2 | 4/2014 | Im et al. | |
| 10,403,853 B2* | 9/2019 | Choung | ............. H01L 51/5088 |
| 10,629,847 B2* | 4/2020 | Choung | ............. H01L 51/5206 |
| 2015/0014639 A1* | 1/2015 | Chung | ................ H01L 27/3276 257/40 |
| 2015/0041777 A1* | 2/2015 | Chung | ................ H01L 51/5271 257/40 |
| 2015/0048361 A1* | 2/2015 | Yamakita | ............ H01L 27/1225 257/43 |

(Continued)

FOREIGN PATENT DOCUMENTS

| | | |
|---|---|---|
| KR | 10-0700013 | 3/2007 |
| KR | 10-2014-0087662 | 7/2014 |

(Continued)

*Primary Examiner* — Ismail A Muse
(74) *Attorney, Agent, or Firm* — F. Chau & Associates, LLC

(57) ABSTRACT

A display device includes a first pixel, a second pixel, and a third pixel. The common electrodes of the first and second pixels have an integrated shape. The hole control layers of the first and second pixels have an integrated shape. The electron control layers of the first and second pixels have an integrated shape. The common electrode, the hole control layer or the electron control layer of the third pixel may be separated from the first pixel and the second pixel.

19 Claims, 11 Drawing Sheets

(56) References Cited

U.S. PATENT DOCUMENTS

| | | | |
|---|---|---|---|
| 2016/0380035 A1 | 12/2016 | Cho et al. | |
| 2017/0250376 A1* | 8/2017 | Sasaki | H01L 51/5275 |
| 2017/0365812 A1* | 12/2017 | Choung | H01L 27/3276 |
| 2019/0181190 A1* | 6/2019 | Sakamoto | H01L 27/3211 |
| 2019/0189954 A1* | 6/2019 | Naganuma | H01L 51/5072 |
| 2019/0293990 A1* | 9/2019 | Kwon | G02F 1/133502 |
| 2019/0305054 A1* | 10/2019 | Tsukamoto | H01L 51/0011 |

FOREIGN PATENT DOCUMENTS

| | | |
|---|---|---|
| KR | 10-2016-0072010 | 6/2016 |
| KR | 10-2017-0001099 | 1/2017 |
| KR | 10-1780814 | 9/2017 |

* cited by examiner

DISPLAY DEVICE INCLUDING A FIRST PIXEL, A SECOND PIXEL AND A THIRD PIXEL AT LEAST PARTIALLY SEPARATED FROM EACH OF THE FIRST PIXEL AND THE SECOND PIXEL

CROSS-REFERENCE TO RELATED APPLICATION

This U.S. non-provisional patent application claims priority under 35 U.S.C. § 119 to Korean Patent Application No. 10-2018-0073866, filed on Jun. 27, 2018, the disclosure of which is incorporated by reference herein in its entirety.

TECHNICAL FIELD

The present inventive concept relates to a display device with increased display quality.

DISCUSSION OF THE RELATED ART

An organic light emitting display device may include a light emitting element, and the light emitting element may generate light when electrons and holes recombine. The organic light emitting display device may have a high response speed and may be driven with low power consumption. However, when the light emitting element emits light due to a leakage current, unselected pixels may emit light, or the brightness of unselected pixels may increase. As a result, image quality may deteriorate and a change of color may occur.

SUMMARY

According to an exemplary embodiment of the present inventive concept, a display device including: a first pixel generating light of a first color and including a first pixel electrode, a first common electrode, a first light emission layer, a first hole control layer, and a first electron emission layer disposed between the first light emission layer and the first common electrode, wherein the first light emission layer is disposed between the first pixel electrode and the first common electrode, and wherein the first hole control layer is disposed between the first light emission layer and the first pixel electrode; a second pixel generating light of a second color different from the first color and including a second pixel electrode, a second common electrode, a second light emission layer, a second hole control layer, and a second electron control layer disposed between the second light emission layer and the second common electrode and connected to the first electron control layer, wherein the second common electrode is connected to the first common electrode, wherein the second light emission layer is disposed between the second pixel electrode and the second common electrode, wherein the second hole control layer is disposed between the second light emission layer and the second pixel electrode and connected to the first hole control layer; and a third pixel generating light of a third color different from the first color and the second color and including a third pixel electrode, a third common electrode, a third light emission layer, a third hole control layer, and a third electron control layer disposed between the third light emission layer and the third common electrode, wherein the third light emission layer is disposed between the third pixel electrode and the third common electrode, wherein the third hole control layer is disposed between the third light emission layer and the third pixel electrode, and wherein at least one of the third common electrode, the third hole control layer, and the third electron control layer is separated from the first pixel and the second pixel.

In an exemplary embodiment of the present inventive concept, the first color is red, the second color is blue, and the third color is green.

In an exemplary embodiment of the present inventive concept, the third hole control layer is separated from the first hole control layer and the second hole control layer.

In an exemplary embodiment of the present inventive concept, the third common electrode is connected to the first common electrode and the second common electrode, and the third electron control layer is connected to the first electron control layer and the second electron control layer.

In an exemplary embodiment of the present inventive concept, the third common electrode is separated from the first common electrode and the second common electrode.

In an exemplary embodiment of the present inventive concept, the third electron control layer is separated from the first electron control layer and the second electron control layer.

In an exemplary embodiment of the present inventive concept, the third hole control layer is connected to the first hole control layer and the second hole control layer.

In an exemplary embodiment of the present inventive concept, the display device further includes an insulating layer including a plurality of opening parts providing a first pixel light emission area of the first pixel, a second pixel light emission area of the second pixel, and a third pixel light emission area of the third pixel.

In an exemplary embodiment of the present inventive concept, the plurality of opening parts include a first pixel opening part providing the first pixel light emission area, a second pixel opening part providing the second pixel light emission area, and a third pixel opening part providing the third pixel light emission area, wherein an area of each of the first pixel light emission area, the second pixel light emission area, and the third pixel light emission area is the same as each other or different from each other.

In an exemplary embodiment of the present inventive concept, a first thickness of the insulating layer between the third pixel opening part and the first pixel opening part and between the third pixel opening part and the second pixel opening part is greater than a second thickness of the insulating layer between the first pixel opening part and the second pixel opening part.

In an exemplary embodiment of the present inventive concept, the insulating layer includes a triangular shape between the third pixel opening part and the first pixel opening part and between the third pixel opening part and the second pixel opening part, and a quadrilateral shape between the first pixel opening part and the second pixel opening part.

In an exemplary embodiment of the present inventive concept, the first pixel and the second pixel are provided in a plurality such that the first pixels and the second pixels are arranged alternately along a first direction to form a first pixel group, and the third pixel is provided in a plurality such that the third pixels are arranged along the first direction to form a second pixel group, wherein the second pixel group is spaced apart from the first pixel group in a second direction intersecting the first direction, and the third pixel is spaced apart from the first pixel or the second pixel in a third direction intersecting the first direction and the second direction.

In an exemplary embodiment of the present inventive concept, the third hole control layers of the third pixels of the second pixel group are connected to each other, the third electron control layers of the third pixels of the second pixel group are connected to each other, and the third common electrodes of the third pixels of the second pixel group are connected to each other.

In an exemplary embodiment of the present inventive concept, the first hole control layers of the first pixels of the first pixel group and the second hole control layers of the second pixels of the first pixel group are connected to each other, the first electron control layers of the first pixels of the first pixel group and the second electron control layers of the second pixels of the first pixel group are connected to each other, and the first common electrodes of the first pixels of the first pixel group and the second common electrodes of the second pixels of the first pixel group are connected to each other.

In an exemplary embodiment of the present inventive concept, each of the first pixel group and the second pixel group is provided in plural, the first pixel groups and the second pixel groups are alternately arranged along the second direction, the first hole control layers of the first pixels of the first pixel groups and the second hole control layers of the second pixels of the first pixel groups are connected to each other, the first electron control layers of the first pixels of the first pixel groups and the second electron control layers of the second pixels of the first pixel groups are connected to each other, and the first common electrodes of the first pixels of the first pixel groups and the second common electrodes of the second pixels of the first pixel groups are connected to each other.

In an exemplary embodiment of the present inventive concept, each of the first pixel group and the second pixel group is provided in plural, and the first pixel groups and the second pixel groups are alternately arranged along the second direction, wherein the first hole control layer of the first pixel of the n-th first pixel group among the first pixel groups, the second hole control layer of the second pixel of the n-th first pixel group, the first hole control layer of the first pixel of the (n+1)th first pixel group among the first pixel groups, and the second hole control layer of the second pixels of the (n+1)th first pixel group are connected to each other, wherein n is a natural number.

In an exemplary embodiment of the present inventive concept, the third common electrode of the second pixel group is spaced apart from the first and second common electrodes of the first pixel group, the third hole control layer of the second pixel group is spaced apart from the first and second hole control layers of the first pixel group, or the third electron control layer of the second pixel group is spaced apart from the first and second electron control layers of the first pixel group.

According to an exemplary embodiment of the present inventive concept, a display device includes: a first pixel configured to provide red light; a second pixel configured to provide blue light; and a third pixel configured to provide green light, wherein each of the first pixel, the second pixel, and the third pixel includes; a pixel electrode; a common electrode disposed on the pixel electrode; a light emission layer disposed between the pixel electrode and the common electrode; a first auxiliary layer disposed between the pixel electrode and the light emission layer; and a second auxiliary layer disposed between the light emission layer and the common electrode, wherein the first auxiliary layer of the first pixel and the first auxiliary layer of the second pixel have an integrated shape, the second auxiliary layer of the first pixel and the second auxiliary layer of the second pixel have an integrated shape, the common electrode of the first pixel and the common electrode of the second pixel have an integrated shape, and at least one of the first auxiliary layer, the second auxiliary layer, and the common electrode of the third pixel is separated from a corresponding one of the first auxiliary layer, the second auxiliary layer, or the common electrode of the first and second pixels.

In an exemplary embodiment of the present inventive concept, the first auxiliary layer of the third pixel is separated from the first auxiliary layer of the first pixel and the first auxiliary layer of the second pixel, the second auxiliary layer of the third pixel is connected to the second auxiliary layer of the first pixel and the second auxiliary layer of the second pixel, wherein the second auxiliary layer of the first, second and third pixels has an integrated shape, and the common electrode of the third pixel is connected to the common electrode of the first pixel and the common electrode of the second pixel.

In an exemplary embodiment of the present inventive concept, the display device further includes an insulating layer including a plurality of opening parts forming a first pixel light emission area of the first pixel, a second pixel light emission area of the second pixel, and a third pixel light emission area of the third pixel, wherein a first portion of the insulating layer adjacent to the third pixel light emission area has a shape different from a shape of a second portion of the insulating layer adjacent to the first pixel light emission area or the second pixel light emission area.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
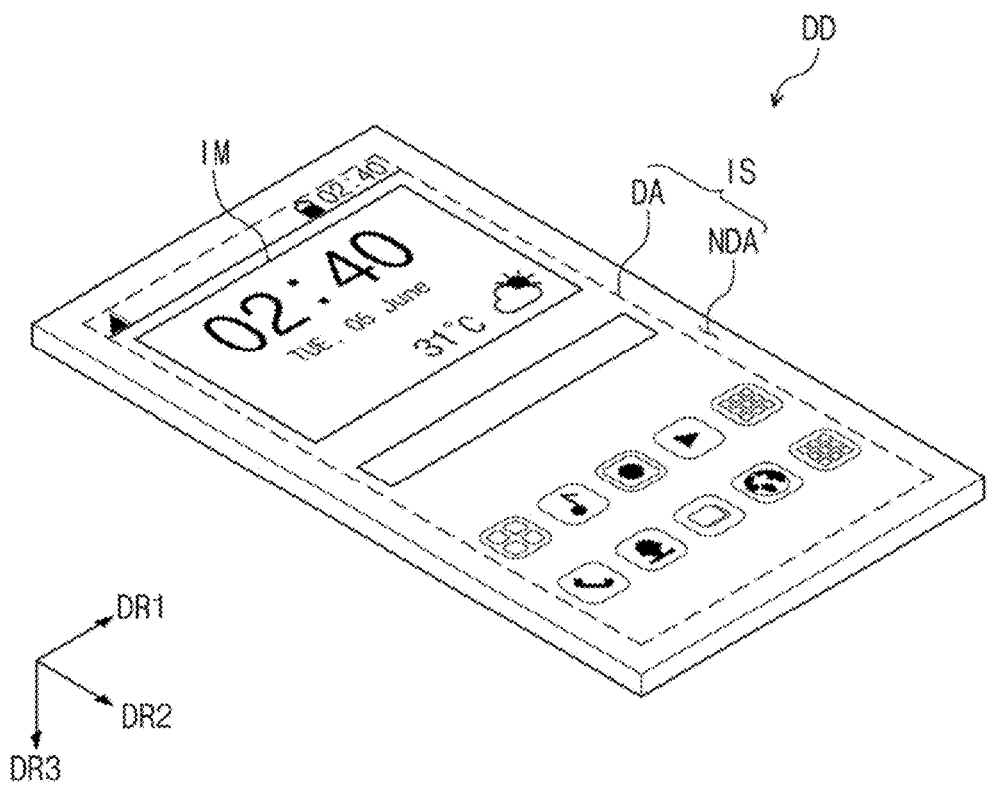
FIG. 1 is a perspective view of a display device according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein.

In this specification, it will be understood that when it is mentioned that a component (or, an area, a layer, a part, etc.) is referred to as being "on", "connected to" or "combined to" another component, this means that the component may be directly on, connected to, or combined to the other component or one or more intervening components may be present therebetween.

In the drawings, like reference numerals may refer to like elements, and thus repetitive descriptions may be omitted. Additionally, in the drawings, the thicknesses, proportions, and dimensions of components may be exaggerated for clarity.

Hereinafter, exemplary embodiments of the present inventive concept will be described with reference to the accompanying drawings.

FIG. 1 is a perspective view of a display device according to an exemplary embodiment of the present inventive concept.

Referring to FIG. 1, a display device DD may display an image IM through a display surface IS. It is shown in FIG. 1 that the display surface IS is parallel to the surface extending in a first direction DR1 and a second direction DR2 intersecting the first direction DR1. However, this is an example, and the present inventive concept is not limited thereto. For example, the display surface of the display device may have a curved shape.

The normal direction of the display surface IS, for example, a thickness direction of the display device DD, indicates a third direction DR3. The front surface (or, e.g., an upper surface) and the rear surface (or, e.g., a lower surface) of each member face each other in the third direction DR3. However, the directions that the first to third directions DR1, DR2, and DR3 indicate may be converted to other directions as a relative concept.

In FIG. 1, a portable electronic device is shown as an example of the display device DD. However, the display device DD may be used in medium-sized electronic devices such as personal computers, notebook computers, personal digital terminals, car navigation units, game machines, smart phones, tablets, and cameras in addition to large-sized electronic devices such as televisions, monitors, or external billboards. However, the present inventive concept is not limited thereto, and the display device DD may be employed in other electronic devices.

The display surface IS includes a display area DA for displaying the image IM and a non-display area NDA adjacent to the display area DA. For example, the non-display area NDA may at least partially surround the display area DA. The non-display area NDA is an area for displaying no image. In FIG. 1, a clock display window and application icons are shown as an example of the image IM.

The display area DA may be a rectangular shape. For example, the non-display area NDA may surround the display area DA. However, the present inventive concept is not limited thereto, and a form of the display area DA and a form of the non-display area NDA may be designed relatively. In addition, the non-display area NDA may not exist on the entire surface of the display device DD. For example, the display area DA may occupy the entire upper surface of the display device DD.

Figure 2:
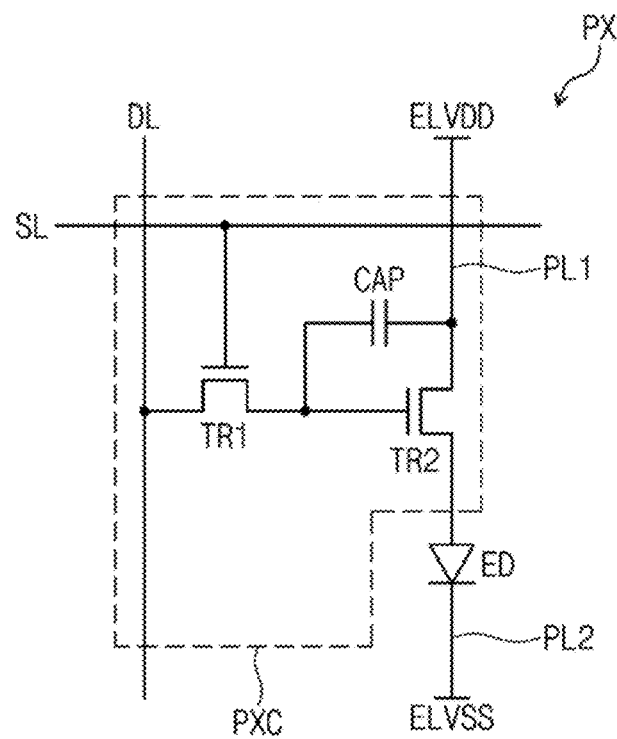
FIG. 2 is a circuit diagram of a pixel according to an exemplary embodiment of the present inventive concept.

FIG. 2 is a circuit diagram of a pixel according to an exemplary embodiment of the present inventive concept.

Referring to FIG. 2, the pixel PX may be connected to a plurality of signal lines. In the present embodiment, among the signal lines, the scan lines SL, the data lines DL, the first power line PL1, and the second power line PL2 are shown as an example. However, this is illustratively shown, and the pixel PX according to an exemplary embodiment of the present inventive concept may be additionally connected to various signal lines and is not limited to any one embodiment.

The pixel PX may include a light emission element ED and a pixel circuit PXC. The pixel circuit PXC may include a first thin film transistor TR1, a capacitor CAP, and a second thin film transistor TR2. The number of thin film transistors and the number of capacitors included in the pixel circuit PXC are not limited to the configuration shown in FIG. 2. For example, in an exemplary embodiment of the present inventive concept, the pixel circuit PXC may further include a light emission control transistor for controlling the timing of the drive current flowing to the light emission element ED in response to a light emission control signal.

The first thin film transistor TR1 may be a switching transistor for controlling ON-OFF of the pixel PX. The first thin film transistor TR1 may transmit or block a data signal transmitted through the data line DL in response to a gate signal transmitted through the scan line SL.

The capacitor CAP is connected to the first thin film transistor TR1 and the first power line PL1. The capacitor CAP charges the amount of charge corresponding to the difference between the data signal transferred from the first thin film transistor TR1 and the first power supply voltage ELVDD applied to the first power line PL1.

The second thin film transistor TR2 is connected to the first thin film transistor TR1, the capacitor CAP, and the light emission element ED. The second thin film transistor TR2 controls the driving current flowing in the light emission element ED in correspondence to the amount of charge stored in the capacitor CAP. The turn-on time of the second thin film transistor TR2 may be determined according to the amount of charge charged in the capacitor CAP. The second thin film transistor TR2 provides the first power supply voltage ELVDD transmitted through the first power line PL1 to the light emission element ED during the turn-on time.

The light emission element ED is connected to the second thin film transistor TR2 and the second power line PL2. The light emission element ED emits light at a voltage corresponding to the difference between the signal transmitted through the second thin film transistor TR2 and the second power supply voltage ELVSS received through the second power line PL2.

The light emission element ED includes a light emitting material. The light emission element ED may generate light of a color corresponding to the light emitting material. The color of the light generated in the light emission element ED may be any one of red, green, blue, and white.

The first thin film transistor TR1 and the second thin film transistor TR2 may be are N-type thin film transistor or a P-type thin film transistor. In addition, in an exemplary embodiment of the present inventive concept, at least one of the first thin film transistor TR1 and the second thin film transistor TR2 may be an N-type thin film transistor and the other of the first and second thin film transistors TR1 and TR2 may be a P-type thin film transistor.

Figure 3:
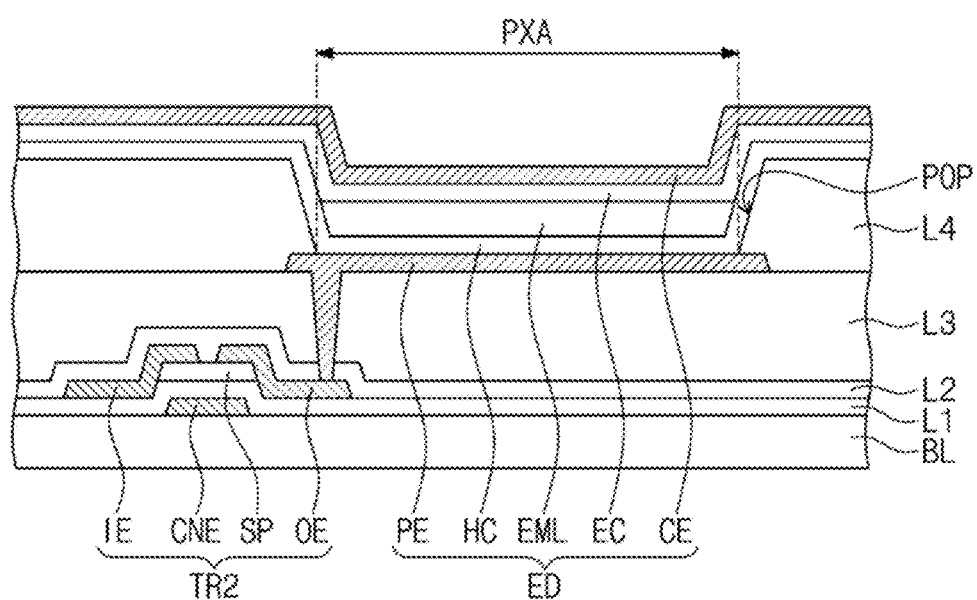
FIG. 3 is a cross-sectional view of a pixel according to an exemplary embodiment of the present inventive concept.

FIG. 3 is a cross-sectional view of a pixel according to an exemplary embodiment of the present inventive concept.

Referring to FIG. 3, the base layer BL may include a material for securing flexibility. For example, the base layer BL may be a plastic substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin. The base layer BL may be a single layer. However, the present inventive concept is not limited thereto, and the base layer BL may be a laminated structure including a plurality of layers. For example, the base layer BL may be a laminated structure including a plurality of insulating layers.

FIG. 3 is a cross-sectional view of the second thin film transistor TR2 and the light emission element ED according to an exemplary embodiment of the present inventive concept.

The second thin film transistor TR2 may include a control electrode CNE, an input electrode IE, an output electrode OE, and a semiconductor pattern SP.

The control electrode CNE may be disposed on the base layer BL. The control electrode CNE may include a conductive material. For example, the conductive material may be a metallic material. The metallic material may include, for example, molybdenum, silver, titanium, copper, aluminum, or alloys thereof.

The first insulating layer L1 may be disposed on the base layer BL and may cover the control electrode CNE. For example, the control electrode CNE may be disposed between the first insulating layer L1 and the base layer BL.

The semiconductor pattern SP may be disposed on the first insulating layer L1. The semiconductor pattern SP may be disposed apart from the control electrode CNE with the first insulating layer L1 disposed therebetween.

The semiconductor pattern SP may include a semiconductor material. The semiconductor material may include at least one of, for example, amorphous silicon, polycrystalline silicon, single crystal silicon, an oxide semiconductor, and/or a compound semiconductor. For example, the semiconductor pattern SP of the first thin film transistor TR2 and the semiconductor pattern of the first thin film transistor TR1 (see, e.g., FIG. 2) may include the same semiconductor material or different materials.

An input electrode IE and an output electrode OE may be disposed on the semiconductor pattern SP.

The second insulating layer L2 may be disposed on the first insulating layer L1 and may cover the semiconductor pattern SP, the input electrode IE, and the output electrode OE. For example, the semiconductor pattern SP, the input electrode IE, and the output electrodes OE may be disposed between the first insulating layer L1 and the second insulating layer L2.

A third insulating layer L3 may be disposed on the second insulating layer L2. For example, the first insulating layer L1 and the second insulating layer L2 may include inorganic materials, and the third insulating layer L3 may include organic materials. The third insulating layer L3 may provide a flat surface. For example, the third insulating layer L3 may provide a flat upper surface.

The light emission element ED may include an organic light emitting diode. However, present the inventive concept is not limited thereto. For example, depending on the type of display device, the light emission element ED may include an inorganic light emitting diode or an organic-inorganic hybrid light emitting diode.

The light emission element ED may include a pixel electrode PE, a first auxiliary layer HC (or, e.g., a hole control layer), a light emission layer EML, a second auxiliary layer EC (or, e.g., an electron control layer), and a common electrode CE.

A pixel electrode PE may be disposed on the third insulating layer L3. The second and third insulating layers L2 and L3 may be provided with through holes, and a part of the output electrode OE may be exposed by the through holes. The pixel electrode PE may be electrically connected to the exposed output electrode OR For example, the pixel electrode PE may be an anode electrode.

A fourth insulating layer L4 may be disposed on the third insulating layer L3. The fourth insulating layer L4 may cover a portion of the pixel electrode PE and may expose another portion of the pixel electrode PE. For example, the fourth insulating layer L4 may be a pixel definition layer. The pixel emission region PXA may correspond to the pixel electrode PE exposed by the fourth insulating layer L4. An opening part POP corresponding to the pixel light emission area PXA may be provided in the fourth insulating layer L4. The opening part POP may be formed by removing a part of the fourth insulating layer L4.

The common electrode CE is disposed on the pixel electrode PE. The common electrode CE may be, for example, a cathode electrode. The common electrode CE may include a material having a low work function to facilitate electron injection.

The pixel electrode PE and the common electrode CE may be a single layer or multiple layers. The pixel electrode PE and the common electrode CE may include a conductive material. For example, the conductive material may be a metal, an alloy, an electrically conductive compound, and a mixture thereof. For example, the pixel electrode PE and the common electrode CE may include at least one of indium zinc oxide (IZO), indium tin oxide (ITO), indium gallium oxide (IGO), indium zinc gallium oxide (IGZO), and mixtures/compounds thereof, and may include molybdenum, silver, titanium, copper, aluminum, or an alloy thereof.

The light emission layer EML may be disposed between the pixel electrode PE and the common electrode CE. The light emission layer EML may be a single layer structure including a single material, a single layer structure including a plurality of different materials, or a multi-layer structure including a plurality of layers of a plurality of different materials.

The light emission layer EML may include an organic material. The organic material is not limited to a particular organic material. For example, the light emission layer EML may include at least one of materials emitting red, green, or blue light, and may include a fluorescent material phosphorescent material.

In addition, the organic material includes a host material and a dopant material. Each of the host material and the dopant material may include a known host and dopant. For example, the host material may be Alq3(tris(8-hydroxyquinolino)aluminum), CBP(4,4'-bis(N-carbazolyl)-1,1'-biphenyl), PVK((poly(n-vinylcabazole), ADN(9,10-di(naphthalene-2-yl)anthracene), TCTA(4,4,4"-Tris(carbazol-9-yl)-triphenylamine), TPBi(1,3,5-tris(N-phenylbenzimidazole-2-yl)benzene), TBADN(3-tert-butyl-9,10-di(naphth-2-yl) anthracene), DSA(distyrylarylene), CDBP(4,4'-bis(9-carbazolyl)-2,2'-dimethyl-biphenyl), or MADN(2-Methyl-9, 10-bis(naphthalen-2-yl)anthracene), but the present inventive concept is not limited thereto.

The dopant material may include a blue dopant, a green dopant, and/or a red dopant. For example, when emitting red light, the light emission layer EML, for example, may include a fluorescent material including PBD:Eu(DBM)3 (phen)(tris(dibenzoylmethanato)phenanthoroline europium) or Perylene.

For example, the red dopant, for example, may be selected from a metal complex or an organometallic complex such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), and PtOEP (octaethylporphyrin platinum), but the present inventive concept is not limited thereto.

When emitting green light, the light emission layer EML, for example, may include a fluorescent material including Alq3(tris(8-hydroxyquinolino)aluminum). For example, the green dopant, for example, may be selected from a metal complex or an organometallic complex such as Ir(ppy)3(fac-tris(2-phenylpyridine)iridium), but the present inventive concept is not limited thereto.

In addition, when emitting blue light, the light emission layer EML, for example, may include a fluorescent material including Spiro-DPVBi, Spiro-6P, DSB(distyryl-benzene), DSA(distyryl-arylene), PFO(Polyfluorene)-based polymer, and/or PPV(poly(p-phenylene vinylene)-based polymer. At this time, the green dopant, for example, may be selected from a metal complex or an organometallic complex such as (4,6-F2ppy)2Irpic, but the present inventive concept is not limited thereto.

The first auxiliary layer HC is disposed between the pixel electrode PE and the light emission layer EML. The first auxiliary layer HC may be an area through which the holes injected from the pixel electrode PE pass to reach the light emission layer EML.

The first auxiliary layer HC may include at least one of a hole injection layer, a hole transport layer, and/or a single layer having both a hole injecting function and a hole transporting function. The first auxiliary layer HC may be formed of a hole injection material and/or a hole transporting material.

For example, when the first auxiliary layer HC includes a hole transport layer, it may include a carbazole-based derivative such as N-phenylcarbazole, polyvinylcarbazole, and the like, a fluorene-based derivative, a Triphenylamine derivative such as TPD(N,N'-bis(3-methylphenyl)-N,N'-diphenyl-[1,1-biphenyl]-4,4'-diamine), TCTA(4,4',4"-tris(N-carbazolyl)triphenylamine), and the like, NPB(N,N'-di(1-naphthyl)-N,N'-diphenylbenzidine), and/or TAPC(4,4'-Cyclohexylidene bis(N,N-bis(4-methylphenyl) benzenamine). However, the present inventive concept is not limited thereto.

In addition, for example, when the first auxiliary layer HC includes a hole injection layer, it may include at least one of a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4', 4"-tris(3-methylphenylphenylamino) triphenylamine), TDATA(4,4',4"-Tris(N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), and/or PANI/PSS(Polyaniline)/Poly(4-styrenesulfonate)). However, the present inventive concept is not limited thereto.

The first auxiliary layer HC may have a thickness ranging from about 100 Å to about 10,000 Å. For example, the first auxiliary layer may have a thickness ranging from about 100 Å to about 1000 Å. When the first auxiliary layer HC includes both a hole transport layer and a hole injection layer, the thickness of the hole injection layer may range from about 100 Å to about 10,000 Å. For example, the first auxiliary HC including both a hole transport layer and a hole injection layer may have a thickness ranging from about 100 Å to about 1000 Å. In addition, the thickness of the hole transport layer may range from about 50 Å to about 2000 Å. For example, the hole transport layer may have a thickness ranging from about 100 Å to about 1500 Å. At this time, the light emission element ED may transport holes without a substantial increase in driving voltage.

In addition, the first auxiliary layer HC may further include a charge generating material. The charge generating material may be uniformly dispersed in the first auxiliary layer HC to form one single region or may be non-uniformly dispersed to divide the first auxiliary layer into a plurality of regions.

For example, the charge generating material may be a P-dopant. The charge generating material may be one of quinone derivatives, metal oxides, and cyano group-containing compounds, but the present inventive concept is not limited thereto. For example, the p-dopant may be quinone derivatives such as TCNQ (tetracyanoquinodimethane) and F4-TCNQ (2,3,4,6-tetrafluoro-tetracyanoquinodimethane), metal oxides such as tungsten oxide and molybdenum oxide, and the like. However, the present inventive concept is not limited thereto.

A second auxiliary layer EC is disposed between the light emission layer EML and the common electrode CE. The second auxiliary layer EC may be an area through which electrons injected from the common electrode CE pass to reach the light emission layer EML.

The second auxiliary layer EC may include at least one of a single layer having an electron injection layer, an electron transport layer, an electron injection function, and/or an electron transport function. The second auxiliary layer EC may be composed of an electron transport material and/or an electron injection material.

For example, when the second auxiliary layer EC includes an electron transport layer, it may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3, 5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate)), ADN(9,10-di(naphthalene-2-yl)anthracene), and a mixture thereof. However, the present inventive concept is not limited thereto.

Furthermore, for example, when the second auxiliary layer EC includes an electron injection layer, it may be a lanthanum group metal such as lithium fluoride (LiF), Lithium quinolate (LiQ), dilithium oxide (Li2O), barium oxide (BaO), sodium chloride (NaCl), caesium fluoride (CsF), and ytterbium (Yb), and/or metal halides such as rubidium chloride (RbCl) and rubidium iodide (RbI). In addition, the electron injection layer may be a material mixed with an electron transport material and an insulating organo metal salt. However, the present inventive concept is not limited thereto The organo metal salt may be a material having an energy hand gap of about 4 eV or more. For example, the organo metal salt may include a metal acetate, a metal benzoate, a metal acetoacetate, a metal acetylacetonate, and/or a metal stearate.

Figure 4:
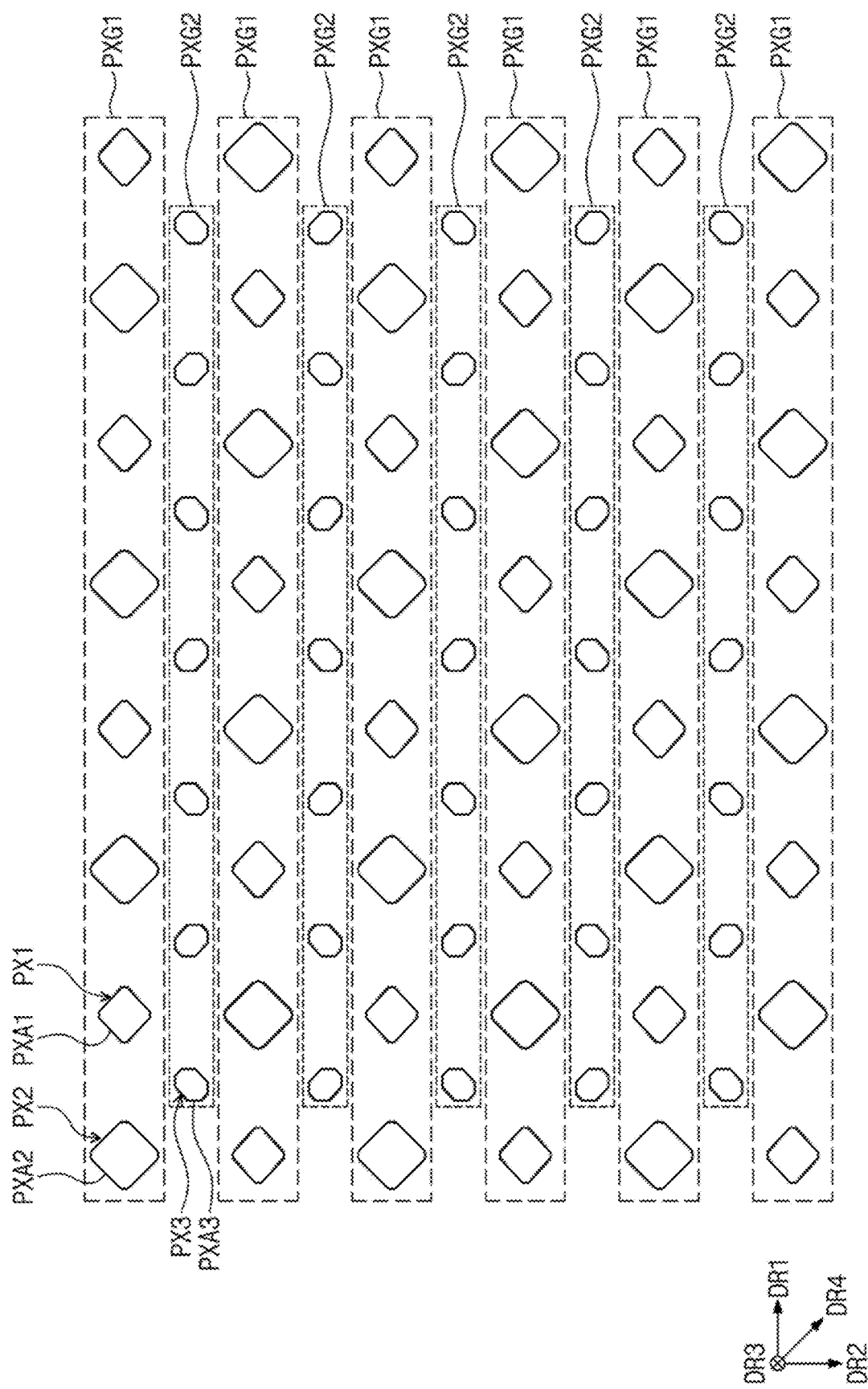
FIG. 4 is an enlarged plan view of a portion of a display device according to an exemplary embodiment of the present inventive concept.

FIG. 4 is an enlarged plan view of a portion of a display device according to an exemplary embodiment of the present inventive concept.

Referring to FIG. 4, the first pixel light emission area PXA1 of the first pixel PX1, the second pixel light emission area PXA2 of the second pixel PX2, and the third pixel light emission area PXA3 of the third pixel PX3 are shown.

Each of the first pixel PX1, the second pixel PX2, and the third pixel PX3 is provided in plurality. For example, the first pixels PX1 may provide red light through the first pixel light emission areas PXA1, the second pixels PX2 may provide blue light through the second pixel light emission areas PXA2, and the third pixels PX3 may provide green light through the third pixel light emission areas PXA3.

The surface areas of the first to third pixel light emission areas PXA1, PXA2, and PXA3 may be different from each other. The surface area of the first to third pixel light emission areas PXA1, PXA2, and PXA3 may be an area viewed on a plane. For example, the area of the second pixel light emission areas PXA2 providing blue light may be the largest and the area of the first pixel light emission areas PXA1 providing red light may be second largest. For example, the area of the third pixel light emission areas PXA3 providing green light may be the smallest of the first to third pixel light emission areas PXA1, PXA2, and PXA3.

The first pixels PX1 and the second pixels PX2 may be arranged alternately along the first direction DR1 to form the first pixel group PXG1. The third pixels PX3 may be arranged along the first direction DR1 to form the second pixel group PXG2.

The second pixel group PXG2 may be disposed apart from the first pixel group PXG1 in the second direction DR2. Each of the first pixel group PXG1 and the second pixel group PXG2 is provided in plurality. The first pixel groups PXG1 and the second pixel groups PXG2 may be alternately arranged along the second direction DR2.

One third pixel PX3 may be spaced apart from one first pixel PX1 or one second pixel PX2 in the fourth direction DR4. The fourth direction DR4 may be a direction between the first direction DR1 and the second direction DR2.

The pixel arrangement structure shown in FIG. 4 may be a pentile structure. However, the present inventive concept is not limited to the pixel arrangement structure shown in FIG. 4. For example, in an exemplary embodiment of the present inventive concept, the pixels may have a stripe structure in which the first pixel, the second pixel, and the third pixel are alternately arranged in sequence along the first direction DR1.

Figure 5:
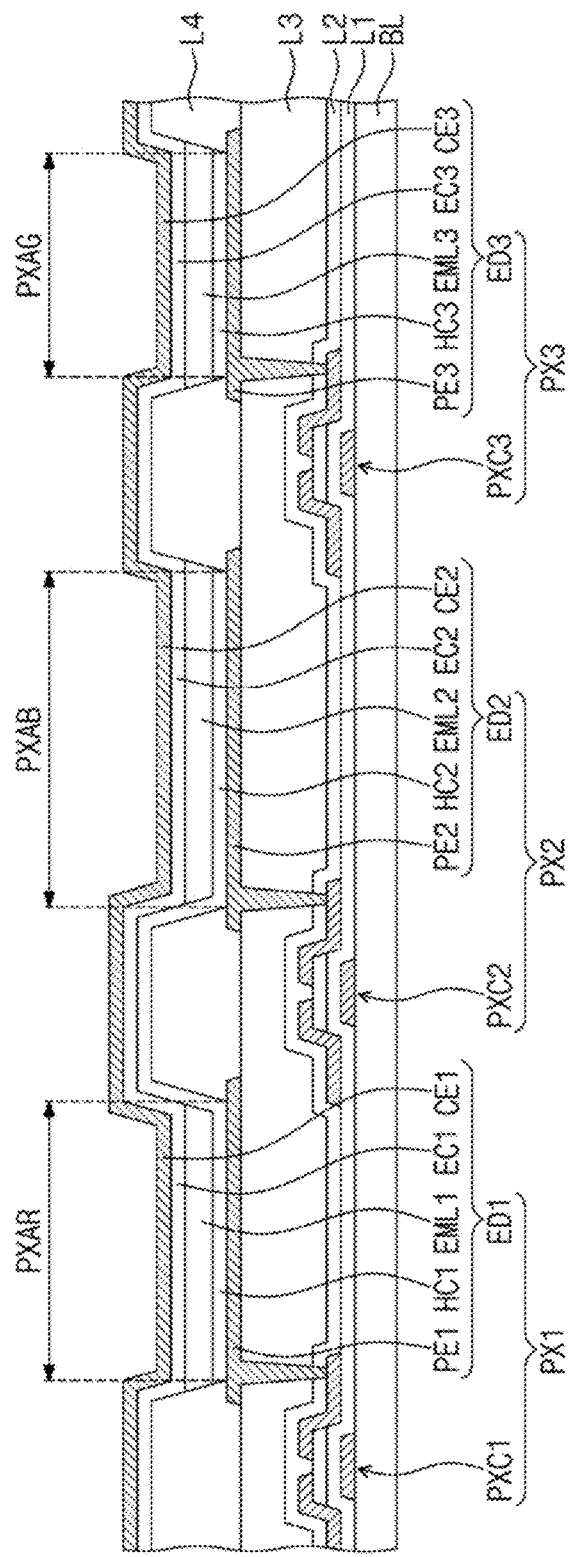
FIG. 5 is a cross-sectional view of pixels according to an exemplary embodiment of the present inventive concept.

FIG. 5 is a cross-sectional view of pixels according to an exemplary embodiment of the present inventive concept.

Referring to FIG. 5, the first pixel PX1, the second pixel PX2, and the third pixel PX3 are shown.

The first pixel PX1 includes a first pixel circuit PXC1 and a first light emission element ED1 electrically connected to the first pixel circuit PXC1. The second pixel PX2 includes a second pixel circuit PXC2 and a second light emission element ED2 electrically connected to the second pixel circuit PXC2. The third pixel PX3 may include a third pixel circuit PXC3 and a third light emission element ED3 electrically connected to the third pixel circuit PXC3. In FIG. 5, each of the first pixel circuit PXC1, the second pixel circuit PXC2, and the third pixel circuit PXC3 may be a partial configuration. For example, each of the first pixel circuit PXC1, the second pixel circuit PXC2, and the third pixel circuit PXC3 may include a second thin film transistor.

The first pixel PX1 provides light of a first color through a first pixel light emission area PXAR. The second pixel PX2 provides light of a second color different from the first color through a second pixel light emission area PXAB. The third pixel PX3 may provide light of a third color different from the first color and the second color through a third pixel light emission area PXAG. The first pixel light emission area PXAR may correspond to the first pixel light emission area PXA1 of FIG. 4. The second pixel light emission area PXAB may correspond to the second pixel light emission area PXA2 of FIG. 4. The third pixel light emission area PXAG may correspond to the third pixel light emission area PXA3 of FIG. 4.

The first light emission element ED1 may include a first pixel electrode PE1, a first common electrode CE1, a first light emission layer EML1 disposed between the first pixel electrode PE1 and the first common electrode CE1, a first hole control layer HC1 disposed between the first pixel electrode PE1 and the first light emission layer EML1, and a first electron control layer EC1 disposed between the first light emission layer EML1 and the first common electrode CE1. The first pixel electrode PE1, the first hole control layer HC1, the first light emission layer EML1, the first electron control layer EC1, and the first common electrode CE1 may correspond to the first pixel light emission area PXAR.

The second light emission element ED2 may include a second pixel electrode PE2, a second common electrode CE2, a second light emission layer EML2 disposed between the second pixel electrode PE2 and the second common electrode CE2, a second hole control layer HC2 disposed between the second pixel electrode PE2 and the second light emission layer EML2, and a second electron control layer EC2 disposed between the second light emission layer EML2, and the second common electrode CE2. The second pixel electrode PE2, the second hole control layer HC2, the second light emission layer EML2, the second electron control layer EC2, and the second common electrode CE2 may correspond to the second pixel light emission area PXAB.

The third light emission element ED3 may include a third pixel electrode PE3, a third common electrode CE3, a third light emission layer EMU disposed between the third pixel electrode PE3 and the third common electrode CE3, a third hole control layer HC3 disposed between the third pixel electrode PE3 and the third light emission layer EML3, and a third electron control layer EC3 disposed between the third light emission layer EML3 and the third common electrode CE3. The third pixel electrode PE3, the third hole control layer HC3, the third light emission layer EML3, the third electron control layer EC3, and the third common electrode CE3 may correspond to the third pixel light emission area PXAG.

At least one of the third common electrode CE3, the third hole control layer HC3 and the third electron control layer EC3 may be separated from a corresponding component among the components of the first pixel PX1 and a corresponding component among the components of the second pixel PX2.

According to an exemplary embodiment of the present inventive concept, the first hole control layer HC1 may be connected to the second hole control layer HC2, the first electron control layer EC1 may be connected to the second electron control layer EC2, and the first common electrode CE1 may be connected to the second common electrode CE2.

According to an exemplary embodiment of the present inventive concept shown in FIG. 5, the third hole control layer HC3 may be separated from the first hole control layer HC1 of the first pixel PX1 and the second hole control layer HC2 of the second pixel PX2. For example, the third electron control layer EC3 may be connected to the first and second electron control layers EC1 and EC2, and the third common electrode CE3 may be connected to the first and second common electrodes CE1 and CE2.

The luminous efficiency of the first pixel PX1, the second pixel PX2, and the third pixel PX3 may be different from each other. For example, when the same voltage is applied to the pixel electrodes of the first pixel PX1, the second pixel PX2, and the third pixel PX3, a pixel with a high luminous efficiency may provide light of higher luminance. Therefore, a different driving voltage may be provided for each pixel.

A case where the luminous efficiency of the third pixel PX3 is higher than that of the first pixel PX1 and the second pixel. PX2 will be described as an example. In this specification, a low gradation may be understood as a gradation indicating a luminance of 10 cd/m2 or less. For example, a low gradation may be a gradation indicating a luminance of 2cd/m2. A case where the first to third pixels PX1, PX2, and PX3 all emit light to display a low-gradation white image will be described as an example. In this case, a voltage higher than that of the third pixel PX3 may be applied to the first pixel PX1 or the second pixel PX2 having a relatively low luminous efficiency. Therefore, a current leaked in the first pixel PX1 or the second pixel PX2 may occur, and charges may move through a layer (for example, a hole control layer) connected between the first to third pixels PX1, PX2, and PX3. For example, when the charge moves to a pixel having a high luminous efficiency, a pixel having a high luminous efficiency may emit light at a higher luminance, thereby causing a color mixture phenomenon.

According to an exemplary embodiment of the present inventive concept, a part of the configuration of the pixel with the highest luminous efficiency is separated from the configuration of the remaining pixels. Therefore, the phenomenon that the charge generated in the remaining pixels other than the pixel having the highest luminous efficiency being moved to the pixel having a high luminous efficiency may be prevented. As a result, the phenomenon that the specific pixel provides light of a luminance higher than the desired luminance thereby distorting the color coordinate may be reduced, and thus the display quality may be increased. Further, corresponding configurations of the remaining pixels may be connected to each other. Thus, the area of the deposition area for forming the connected configurations may be increased. Thus, the deposition failure whose occurrence probability increases as the deposition area is decreased may be reduced.

Figure 6:
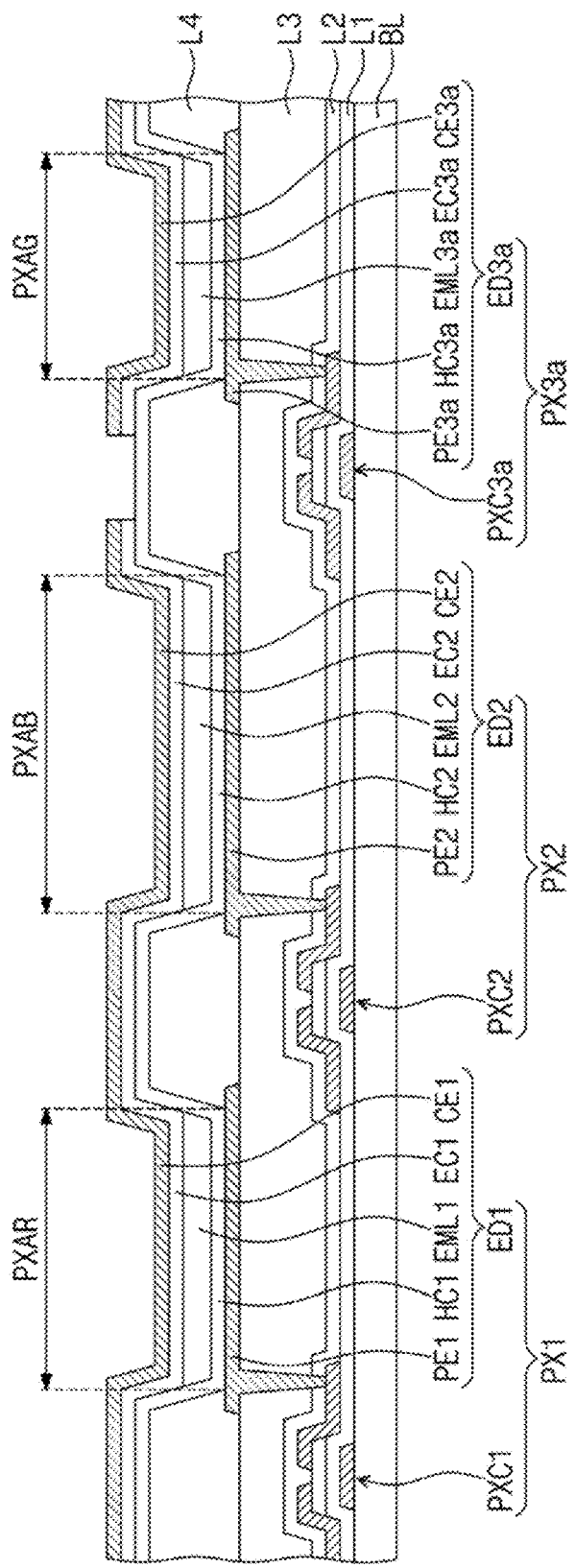
FIG. 6 is a cross-sectional view of pixels according to an exemplary embodiment of the present inventive concept.

FIG. 6 is a cross-sectional view of pixels according to an exemplary embodiment of the present inventive concept.

Referring to FIG. 6, a first pixel PX1, a second pixel PX2, and a third pixel PX3a are shown. Since the first pixel PX1 and the second pixel PX2 are similar to those described with reference to FIG. 5, the description of the first pixel PX1 and the second pixel PX2 may be omitted.

The third pixel PX3a may include a third pixel circuit PXC3a and a third light emission element ED3a electrically connected to the third pixel circuit PXC3a.

The third light emission element ED3a may include a third pixel electrode PE3a and a third common electrode CE3a, a third light emission layer EML3a disposed between the third pixel electrode PE3a and the third common electrode CE3a, a third hole control layer HC3a disposed between the third pixel electrode PE3a and the third light emission layer EML3a, and a third electron control layer EC3a disposed between the third light emission layer EML3a and the third common electrode CE3a.

The third hole control layer HC3a may be connected to the first hole control layer HC1 of the first pixel PX1 and the second hole control layer HC2 of the second pixel PX2. For example, the first hole control layer HC1, the second hole control layer HC2 and the third hole control layer HC3a may be a continuous layer. The third electron control layer EC3a may be separated from the first electron control layer EC1 of the first pixel PX1 and the second electron control layer EC2 of the second pixel PX2. For example, the third electron control layer EC3a may be electrically insulated from the first electron control layer EC1 and the second electron control layer EC2. The third common electrode CE3a may be separated from the first common electrode CE1 of the first pixel PX1 and the second common electrode CE2 of the second pixel PX2. For example, the third common electrode CE3a may be electrically insulated from the first common electrode CE1 and the second common electrode CE2.

In an exemplary embodiment of the present inventive concept, the third common electrode CE3a of the third pixel PX3a and the third electron control layer EC3a of the third pixel PX3a may be separated from the corresponding configuration (for example, the first and second common electrodes CE1 and CE2 and the first and second electron control layers EC1 and EC2) of the remaining pixels (for example, the first pixel PX1 and the second pixel PX2). Therefore, the electrons of the first and second electron control layers EC1 and EC2 may be prevented from moving to the third electron control layer EC3a. As a result, the defect in which a specific pixel provides light of a luminance higher than the desired luminance due to undesired movement of electrons, thereby distorting the color coordinate, may be prevented, and thus the display quality may be increased.

According to an exemplary embodiment of the present inventive concept, since the third common electrode CE3a. Is separated from the first and second common electrodes CE1 and CE2, a different voltage from those of the first common electrode CE1 and the second common electrode CE2 may be provided to the third common electrode CE3a. For example, in consideration of the luminous efficiency of the first to third pixels PX1 PX2, and PX3a, the first common voltage supplied to the first common electrode CE1 and the second common electrode CE2 and the second common voltage supplied to the third common electrode CE3a may be determined.

Further, according to an exemplary embodiment of the present inventive concept, the same voltage as the first common electrode CE1 and the second common electrode CE2 may be provided to the third common electrode CE3a. For example, the same voltage may be simultaneously applied to the third common electrode CE3a, the first common electrode CE1, and the second common electrode CE2. According to an exemplary embodiment of the present inventive concept, the same common voltage may be provided to the third common electrode CE3a and the first common electrode CE1 and the second common electrode CE2, but the common voltage may not be simultaneously provided to the first common electrode CE1 and the second common electrode CE2.

Figure 7:
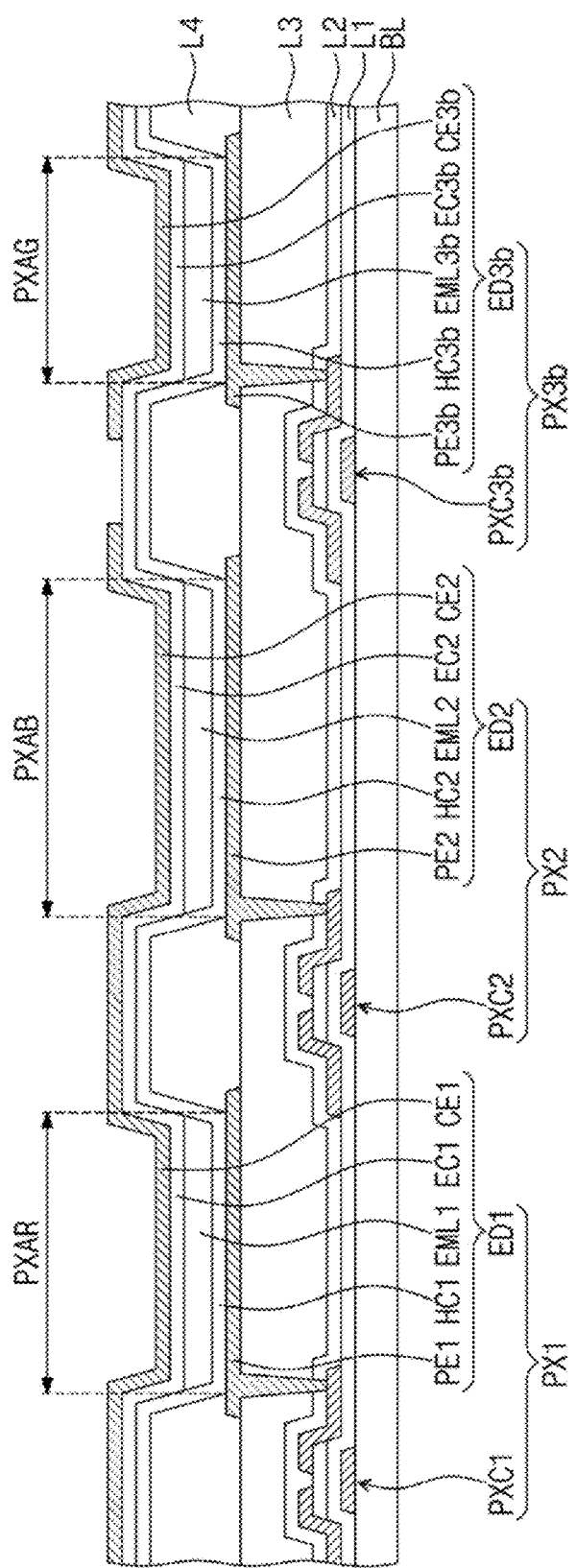
FIG. 7 is a cross-sectional view of pixels according to an exemplary embodiment of the present inventive concept.

FIG. 7 is a cross-sectional view of pixels according to an exemplary embodiment of the present inventive concept.

Referring to FIG. 7, a first pixel PX1, a second pixel PX2, and a third pixel PX3b are shown. Since the first pixel PX1 and the second pixel PX2 are similar to those described with reference to FIG. 5, the description of the first pixel PX1 and the second pixel PX2 may be omitted.

The third pixel PX3b may include a third pixel circuit PXC3b and a third light emission element ED3b electrically connected to the third pixel circuit PXC3b.

The third light emission element ED3b may include a third pixel electrode PE3b, a third common electrode CE3b, a third light emission layer EML3b disposed between the third pixel electrode PE3b and the third common electrode CE3b, a third hole control layer HC3b disposed between the third pixel electrode PE3b and the third light emission layer EML3b, and a third electron control layer EC3b disposed between the third light emission layer EML3b and the third common electrode CE3b.

The third hole control layer HC3b may be connected to the first hole control layer HC1 and the second hole control layer HC2. The third electron control layer EC3b may be connected to the first electron control layer EC1 of the first pixel PX1 and the second electron control layer EC2 of the second pixel PX2. The third common electrode CE3b may be separated from the first common electrode CE1 of the first pixel PX1 and the second common electrode CE2 of the second pixel PX2.

According to an exemplary embodiment of the present inventive concept, since the third common electrode CE3b is separated from the first and second common electrodes CE1 and CE2, a different voltage from those of the first common electrode CE1 and the second common electrode CE2 may be provided to the third common electrode CE3b. The magnitude of the common voltage provided to the third common electrode CE3b may be determined in consideration of electrons that are moved from the first electron control layer EC1 and the second electron control layer EC2 to the third electron control layer EC3b. Therefore, defects in which the color coordinates are distorted may be prevented, and the display quality may be increased accordingly.

Figure 8:
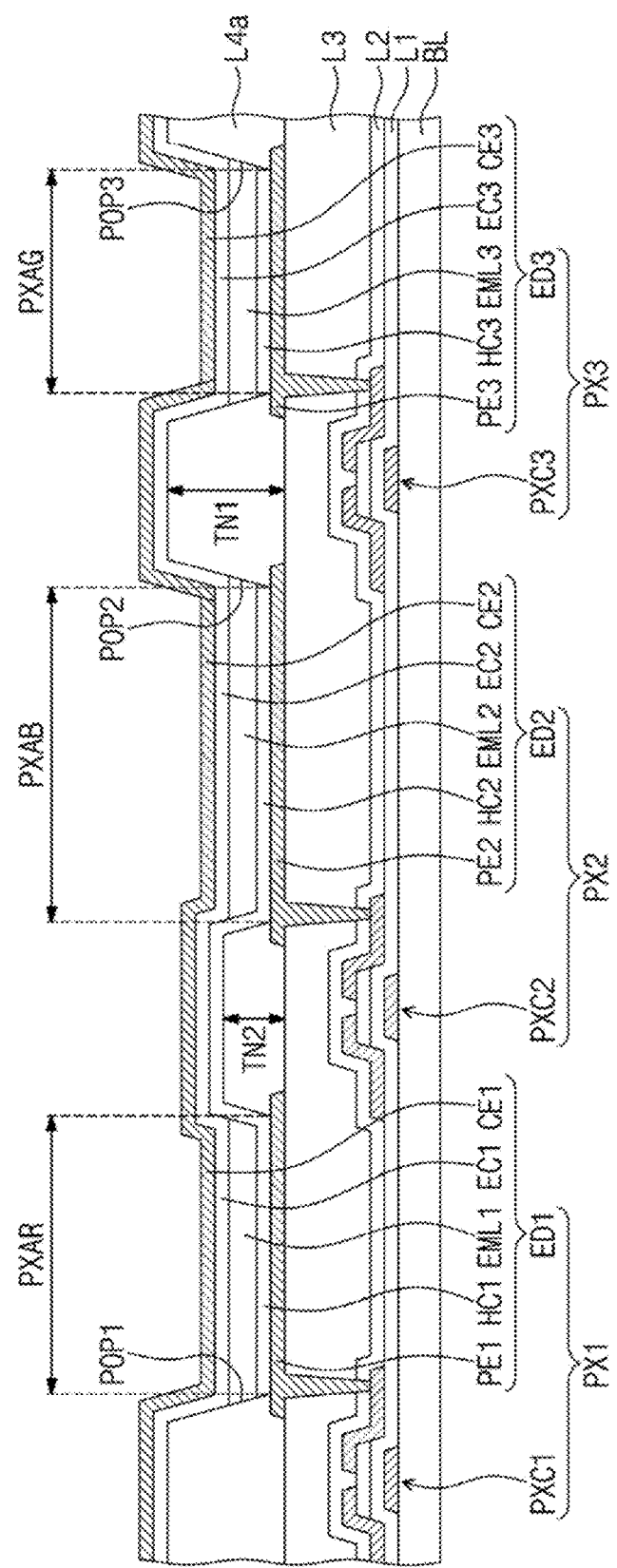
FIG. 8 is a cross-sectional view of pixels according to an exemplary embodiment of the present inventive concept.

FIG. 8 is a cross-sectional view of pixels according to an exemplary embodiment of the present inventive concept.

Compared with FIG. 5, FIG. 8 illustrates the fourth insulating layer L4a including a shape different from that of FIG. 5. The fourth insulating layer L4a of FIG. 8 may have a different thickness depending on the area of the display device DD.

The fourth insulating layer L4a may include a plurality of opening parts POP1, POP2, and POP3. The plurality of opening parts POP1, POP2, and POP3 may include a first pixel opening part POP1, a second pixel opening part POP2, and a third pixel opening part POP3.

The first pixel opening part POP1 exposes the first pixel electrode PE1 to form a first pixel light emission area PXAR. The second pixel opening part POP2 exposes the second pixel electrode PE2 to form a second pixel light emission area PXAB. The third pixel opening part POP3 exposes the third pixel electrode PE3 to form the third pixel light emission area PXAG.

The fourth insulating layer L4a around the third pixel opening part POP3 may have a first thickness TN1. For example, a fourth insulating layer L4a between the third pixel opening part POP3 and the first pixel opening part POP1 and between the third pixel opening part POP3 and the second pixel opening part POP2 may have a first thickness TN1. The first thickness TN1 may be the thickness of a portion of the fourth insulating layer L4a having the maximum thickness.

The first thickness TN1 may be greater than the thickness of the fourth insulating layer L4a around either the first pixel opening part POP1 or the second pixel opening part POP2. For example, the first thickness TN1 may be greater than a second thickness TN2 of the fourth insulating layer L4a between the first pixel opening part POP1 and the second pixel opening part POP2.

In addition, during the process of forming the first to third hole control layers HC1, HC2, and HC3, a defect, in which the third hole control layer HC3 is connected to the first hole control layer HC1 or the second hole control layer HC2, may occur. Since the thickness of the fourth insulating layer L4a around the third pixel opening part POP3 is thick, the path from the first hole control layer HC1 or the second hole control layer HC2 to the third hole control layer HC3 of the third pixel PX3 may increase. Therefore, the probability that the charge of the first hole control layer HC1 or the second hole control layer HC2 is moved to the third hole control layer HC3 may be reduced. Accordingly, the phenomenon that a specific pixel provides light of a luminance higher than the desired luminance due to the undesired movement of the charge, thereby distorting the color coordinate, may be reduced, and thus the display quality may be increased.

Figure 9:
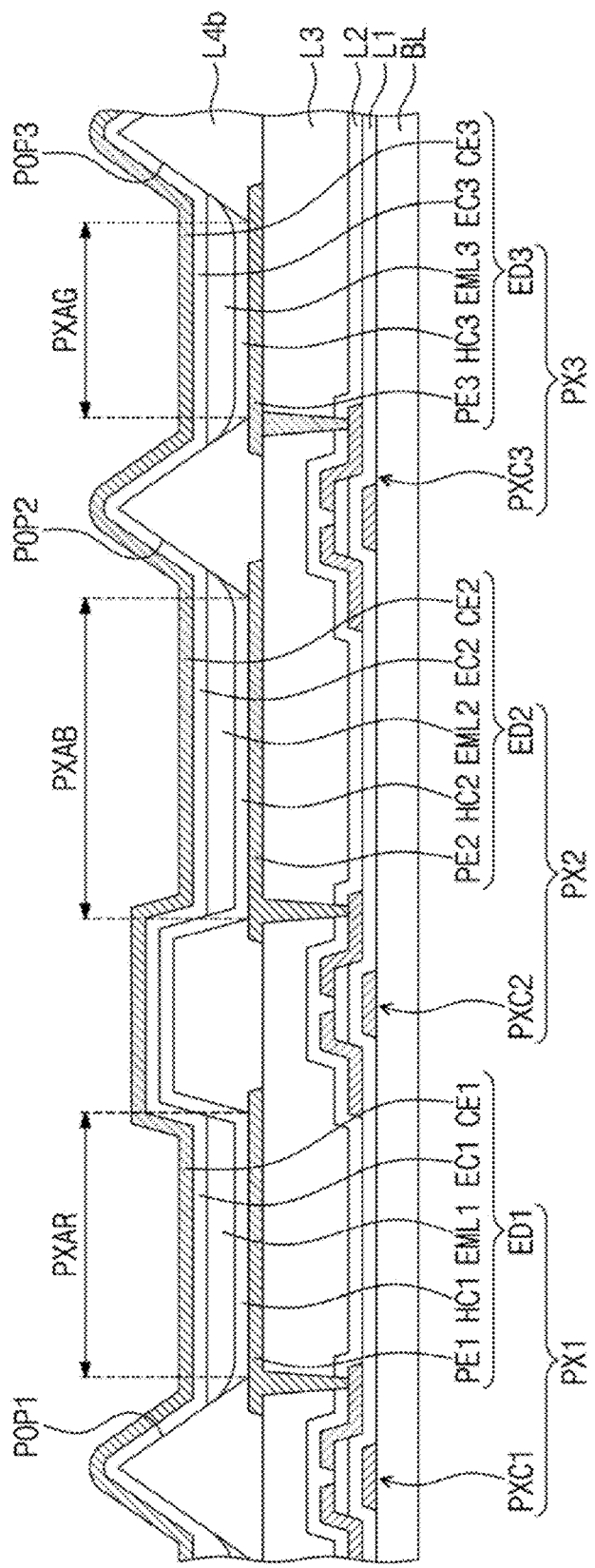
FIG. 9 is a cross-sectional view of pixels according to an exemplary embodiment of the present inventive concept.

FIG. 9 is a cross-sectional view of pixels according to an exemplary embodiment of the present inventive concept.

Compared with FIG. 5, FIG. 9 illustrates the fourth insulating layer L4a including a shape different from that of FIG. 5. On a section, the fourth insulating layer L4b of FIG. 9 may have a different shape depending on the region of the display device DD.

The fourth insulating layer L4b around the third pixel opening part POP3 may have a more pointed shape than the fourth insulating layer L4b around the first pixel opening part POP1 and/or the fourth insulating layer L4b around the second pixel opening part POP2. For example, the fourth insulating layer L4b between the third pixel opening part POP3 and the first pixel opening part POP1 and between the third pixel opening part POP3 and the second pixel opening part POP2 may have a more pointed shape than the fourth insulating layer L4b between the first pixel opening part POP1 and the second pixel opening part POP2. For example, the pointed shape may be a triangular shape.

For example, the fourth insulating layer L4b around the third pixel opening part POP3 may have a triangular shape on a section, and the fourth insulating layer L4b around the first pixel opening part POP1 and/or the second pixel opening part POP2 may have a quadrilateral shape on a section. For example, the fourth insulating layer L4b around the first pixel opening part POP1 and/or the second pixel opening part POP2 may have a trapezoidal shape.

In addition, the fourth insulating layer L4b around the third pixel opening part POP3 may be thicker than the fourth insulating layer L4b around the first pixel opening part POP1 and/or the fourth insulating layer L4b around the second pixel opening part POP2.

It may be easier to separate the third hole control layer HC3 from the first hole control layer HC1 and the second hole control layer HC2 by the shape of the fourth insulating layer L4b.

Figure 10:
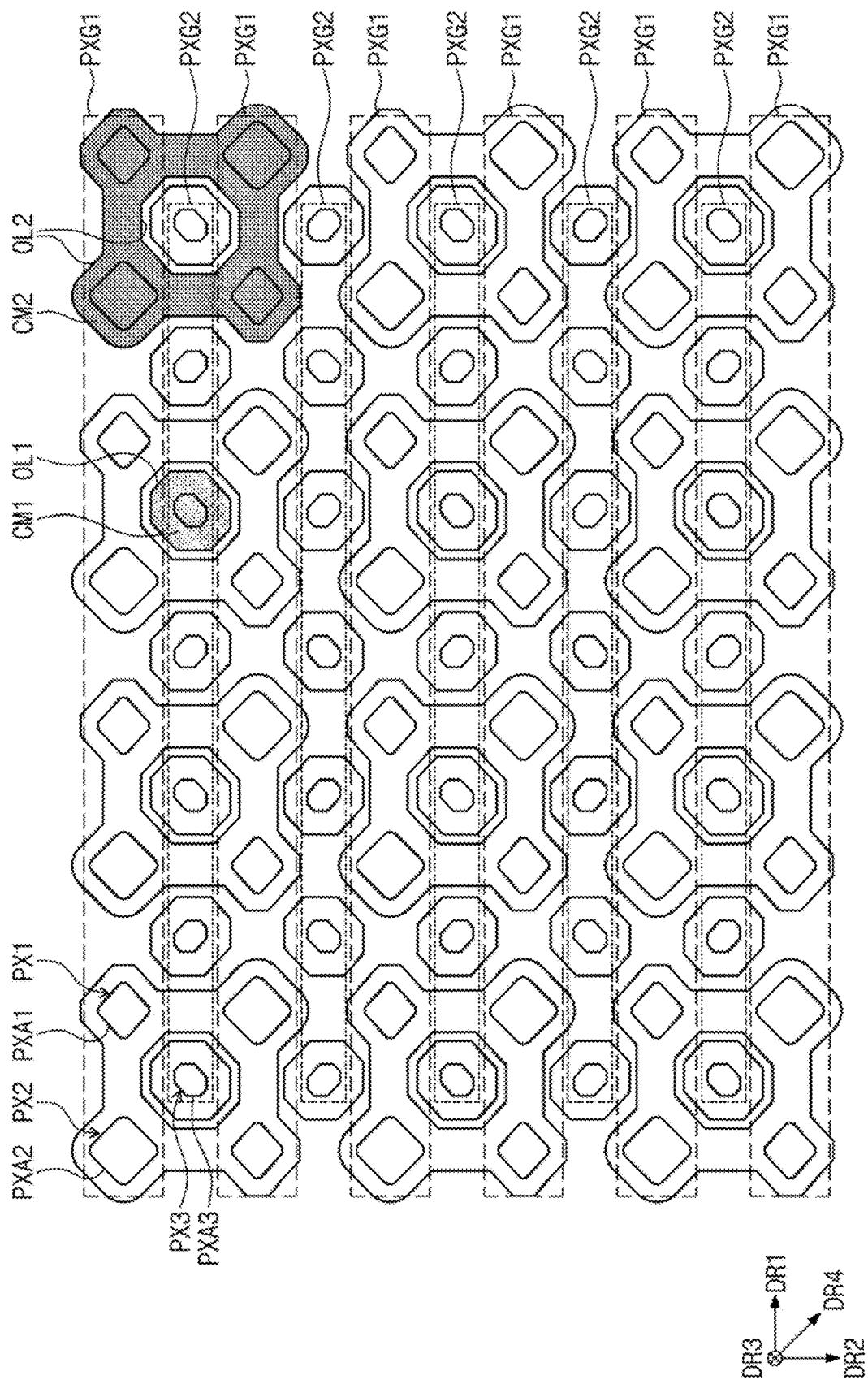
FIG. 10 is an enlarged plan view of a portion of a display device according to an exemplary embodiment of the present inventive concept.

FIG. 10 is an enlarged plan view of a portion of a display device according to an exemplary embodiment of the present inventive concept. In FIG. 10, a first outline OL1 of a first configuration CM1 is shown and a second outline OL2 of a second configuration CM2 is shown. Hereinafter, the first configuration CM1 and the second configuration CM2 will be described in detail. For clarity and as an example, one first configuration CM1 and one second configuration CM2, which are denoted by reference numerals, are shaded and displayed.

Referring to FIGS. 5 and 10, the first configuration CM1 may be separated from the second configuration CM2. For example, the first configuration CM1 and the second configuration CM2 on a plane may not overlap each other. For example, the first configuration CM1 may be the third hole control layer HC3, and the second configuration CM2 may be the first and second hole control layers HC1 and HC2.

Each of the first pixel group PXG1 and the second pixel group PXG2 may be provided in plurality. The first pixel groups PXG1 and the second pixel groups PXG2 may be alternately arranged along the second direction DR2.

The first hole control layer HC1 of the first pixel PX1 of the n-th first pixel group (e.g., n is a natural number) of the first pixel groups PXG1, the second hole control layer HC2 of the second pixel PX2 of the n-th first pixel group, the first hole control layer HC1 of the first pixel PX1 of the (n+1)th first pixel group of the first pixel groups PXG1, and the second hole control layer HC2 of the (n+1)th second pixel PX2 may be connected to each other.

In FIG. 10, two first pixels PX1 and two second pixels PX2, for example, four hole control layers of a total of four pixels, are connected. However, exemplary embodiments of the present inventive concept are not limited thereto. The number of the first pixel PX1 and the number of the second pixels PX2, in which hole control layers are connected to each other, may be two or three, or may be five or more.

Figure 11:
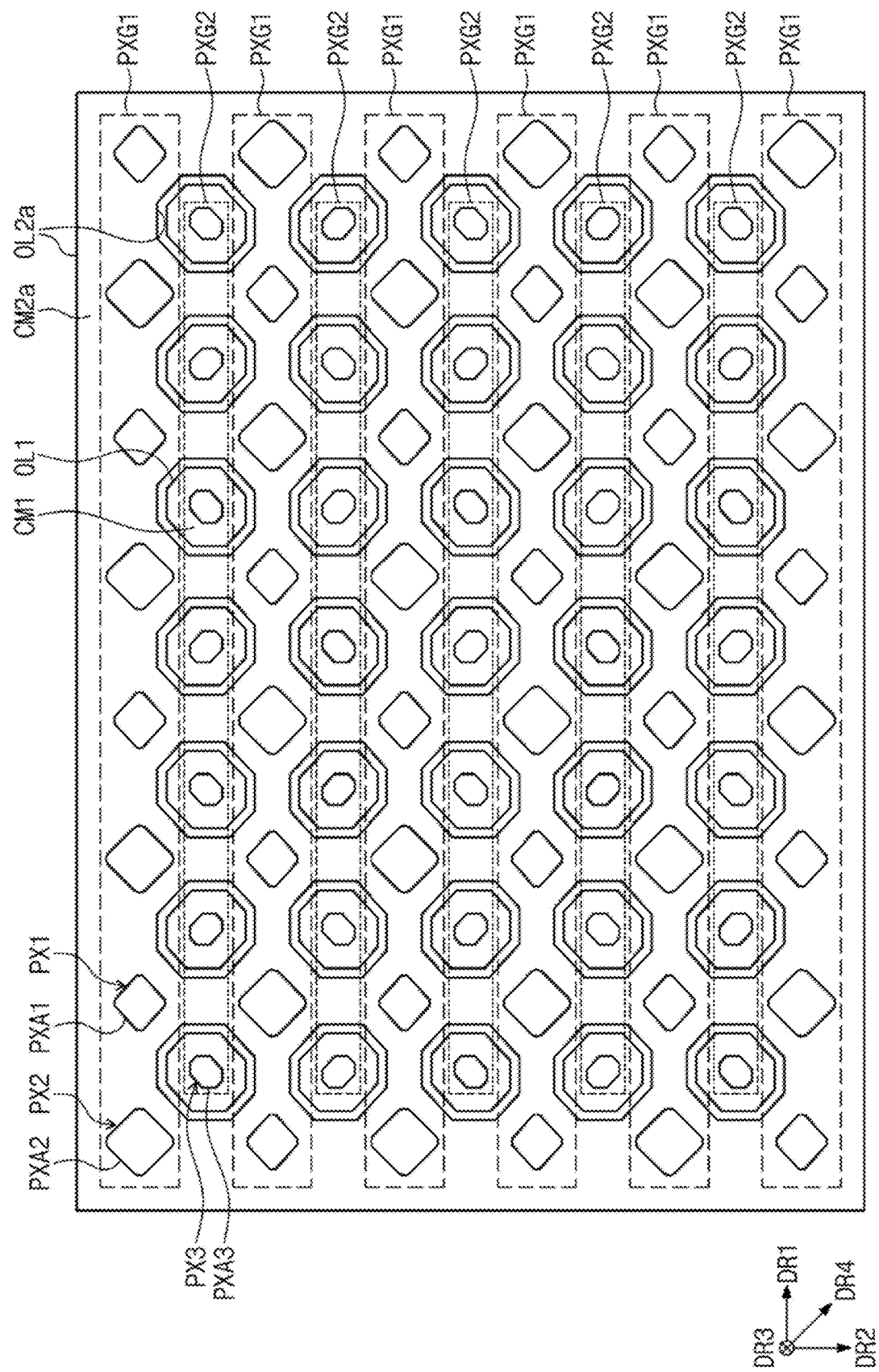
FIG. 11 is an enlarged plan view of a portion of a display device according to an exemplary embodiment of the present inventive concept.

FIG. 11 is an enlarged plan view of a portion of a display device according to an exemplary embodiment of the present inventive concept.

Referring to FIG. 11, a first outline OL1 of a first configuration CM1 is shown and a second outline OL2a of a second configuration CM2a is shown. Hereinafter, the first configuration CM1 and the second configuration CM2a will be described in detail.

Referring to FIGS. 5 and 10, the first configuration CM1 may be the third hole control layer HC3, and the second configuration CM2a may be the first and second hole control layers HC1 and HC2.

Each of the first pixel group PXG1 and the second pixel group PXG2 may be provided in plurality. The first pixel groups PXG1 and the second pixel groups PXG2 may be alternately arranged along the second direction DR2.

The first hole control layers HC1 of the first pixels PX1 and the second hole control layers HC2 of the second pixels PX2 may, all be connected to each other throughout the first and second pixel groups PXG1 and PXG2. For example, only the third hole control layers HC3 of the third pixels PX3 may be separated.

Figure 12:
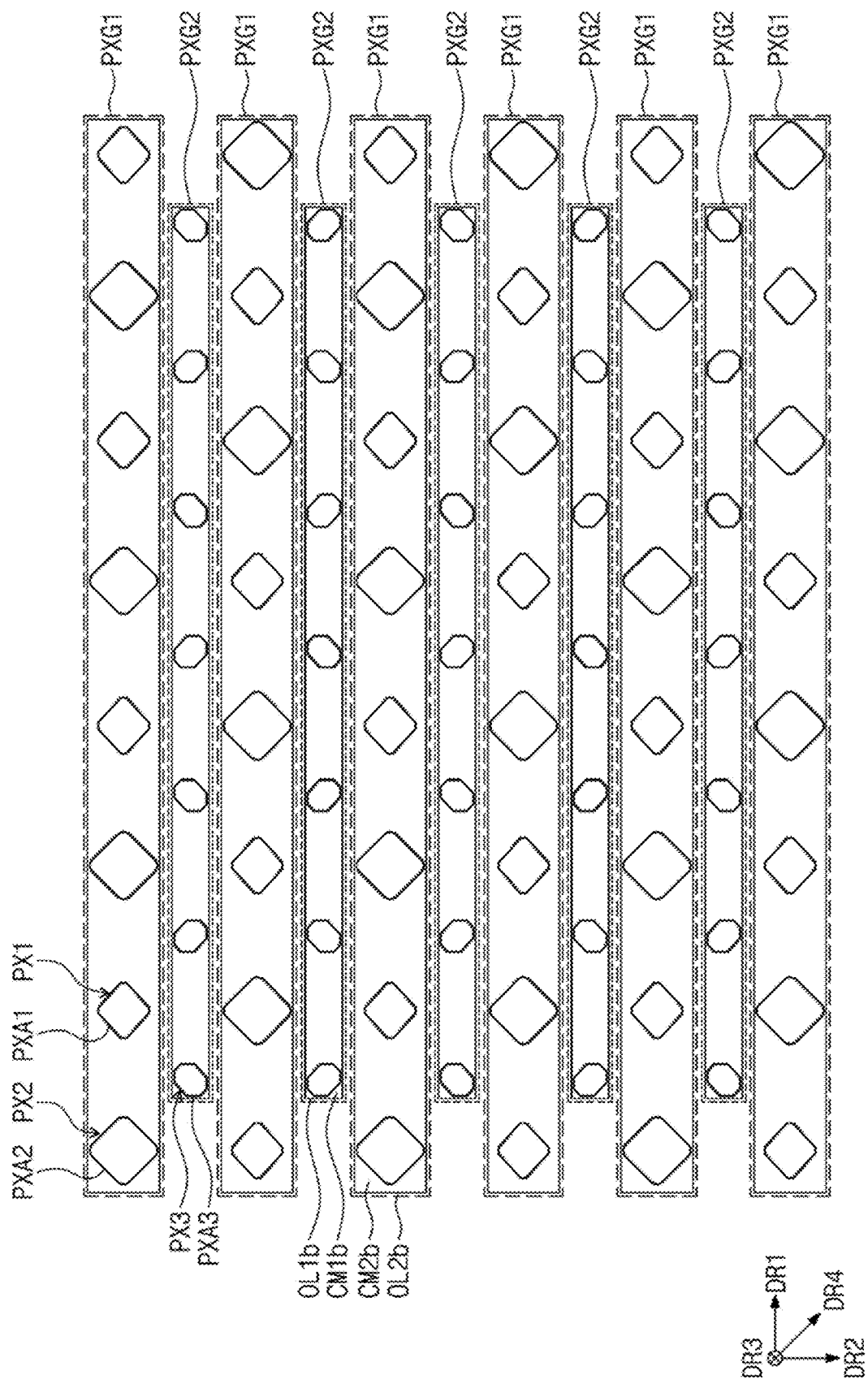
FIG. 12 is an enlarged plan view of a portion of a display device according to an exemplary embodiment of the present inventive concept.

FIG. 12 is an enlarged plan view of a portion of a display device according to an exemplary embodiment of the present inventive concept.

Referring to FIG. 12, a first outline OL1b of a first configuration CM1b is shown and a second outline OL2b of a second configuration CM2b is shown. Hereinafter, the first configuration CM1b and the second configuration CM2b will be described in detail.

Referring to FIGS. 5 and 12, the first configuration CM1b may correspond to the third hole control layer HC3, and the second configuration CM2b may correspond to the first and second hole control layers HC1 and HC2.

The first hole control layers HC1 of the first pixels PX1 and the second hole control layers HC2 of the second pixels PX2, which configure the first pixel group PXG1, may all be connected to each other. The third hole control layers HC3 of the third pixels PX3 configuring the second pixel group PXG2 may be connected to each other. In addition, the hole control layers of the first pixel group PXG1 may be separated from the hole control layers of the second pixel group PXG2.

Referring to FIGS. 6 and 12, the first configuration CM1b may correspond to a third electron control layer EC3a and a third common electrode CE3a, and the second configuration CM2b may correspond to the first and second electron control layers EC1 and EC2 and the first and second common electrodes CE1 and CE2.

The first electron control layers EC1 of the first pixels PX1 and the second electron control layers EC2 of the second pixels PX2, which configure the first pixel group PXG1, are connected to each other, and the first common electrodes CE1 of the first pixels PX1 and the second common electrodes CE2 of the second pixels PX2, which configure the first pixel group PXG1, are connected to each other. The third electron control layers EC3a of the third pixels PX3 configuring the second pixel group PXG2 are connected to each other, and the third common electrodes CE3 of the third pixels PX3 configuring the second pixel group PXG2 may be connected to each other.

Referring to FIGS. 7 and 12, the first configuration CM1b may correspond the third common electrode CE3b, and the second configuration CM2b may correspond to the first and second common electrodes CE1 and CE2. The first common electrode CE1 of the first pixels PX1 and the second common electrode CE2 of the second pixels PX2, which configure the first pixel group PXG1, are connected to each other, and the third common electrodes CE3b of the third pixels PX3b configuring the second pixel group PXG2 may be connected to each other. In addition, the common electrodes of the first pixel group PXG1 and the second pixel group PXG2 may be separated from each other. Therefore, the first pixel group PXG1 may receive a voltage different from that of the common electrode overlapping the second pixel group PXG2. For example, in consideration of the luminous efficiency of each of the first to third pixels PX1, PX2, and PX3a, the first common voltage supplied to the first common electrode CE1 and the second common electrode CE2 and the second common voltage supplied to the third common electrode CE3a may be determined.

According to an exemplary embodiment of the present inventive concept, a part of the configuration of the pixel with the highest luminous efficiency is separated from a part of the corresponding configuration of the remaining pixels. For example, the configuration may be at least one of a hole control layer, an electron control layer, and a common electrode. Therefore, even if the current is leaked, the phenomenon that the charge or the electron is moved to the pixel having the highest luminous efficiency may be reduced. As a result, the phenomenon that the specific pixel provides light of a luminance higher than the desired luminance thereby twisting the color coordinate may be reduced, and thus the display quality may be increased.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:
1. A display device comprising:
a first pixel generating light of a first color and comprising a first pixel electrode, a first common electrode, a first light emission layer, a first hole control layer, and a first electron control layer disposed between the first light emission layer and the first common electrode, wherein the first light emission layer is disposed between the first pixel electrode and the first common electrode, and wherein the first hole control layer is disposed between the first light emission layer and the first pixel electrode and the first hole control layer directly in contact with the first light emission layer and the first pixel electrode;

a second pixel generating light of a second color different from the first color and comprising a second pixel electrode, a second common electrode, a second light emission layer, a second hole control layer and a second electron control layer disposed between the second light emission layer and the second common electrode and connected to the first electron control layer, wherein the second common electrode is connected to the first common electrode, wherein the second light emission layer is disposed between the second pixel electrode and the second common electrode, wherein the second hole control layer is disposed between the second light emission layer and the second pixel electrode, the second hole control layer is connected to the first hole control layer, and the second hole control layer is directly in contact with the second light emission layer and the second pixel electrode; and a third pixel generating light of a third color different from the first color and the second color and comprising a third pixel electrode, a third common electrode, a third light emission layer, a third hole control layer, and a third electron control layer disposed between the third light emission layer and the third common electrode, wherein the third light emission layer is disposed between the third pixel electrode and the third common electrode, wherein the third hole control layer is disposed between the third light emission layer and the third pixel electrode, and the third hole control layer is directly in contact with the third light emission layer and the third pixel electrode, and wherein at least one of the third common electrode, a portion of the third hole control layer directly contacting the third pixel electrode, and the third electron control layer is separated from the first pixel and the second pixel.

2. The display device of claim 1, wherein the first color is red, the second color is blue, and the third color is green.

3. The display device of claim 1, wherein the third hole control layer is separated from the first hole control layer and the second hole control layer.

4. The display device of claim 3, wherein the third common electrode is connected to the first common electrode and the second common electrode, and the third electron control layer is connected to the first electron control layer and the second electron control layer.

5. The display device of claim 1, wherein the third common electrode is separated from the first common electrode.

6. The display device of claim 5, wherein the third electron control layer is separated from the first electron control layer and the second electron control layer.

7. The display device of claim 5, wherein the third hole control layer is connected to the first hole control layer and the second hole control layer.

8. The display device of claim 1, further comprising an insulating layer including a plurality of opening parts providing a first pixel light emission area of the first pixel, a second pixel light emission area of the second pixel, and a third pixel light emission area of the third pixel.

9. The display device of claim 8, wherein the plurality of opening parts comprise a first pixel opening part providing the first pixel light emission area, a second pixel opening part providing the second pixel light emission area, and a third pixel opening part providing the third pixel light emission area, wherein an area of each of the first pixel light emission area, the second pixel light emission area, and the third pixel light emission area is the same as each other or different from each other.

10. The display device of claim 9, wherein a first thickness of the insulating layer between the third pixel opening part and the first pixel opening part and between the third pixel opening part and the second pixel opening part is greater than a second thickness of the insulating layer between the first pixel opening part and the second pixel opening part.

11. The display device of claim 9, wherein the insulating layer includes a triangular shape between the third pixel opening part and the first pixel, opening part and between the third pixel opening part and the second pixel opening part, and a quadrilateral shape between the first pixel opening part and the second pixel opening part.

12. A display device comprising:

a first pixel generating light of a first color and comprising a first pixel electrode, a first common electrode, a first light emission layer, a first hole control layer, and a first electron control layer disposed between the first light emission layer and the first common electrode, wherein the first light emission layer is disposed between the first pixel electrode and the first common electrode, and wherein the first hole control layer is disposed between the first light emission layer and the first pixel electrode;

a second pixel generating light of a second color different from the first color and comprising a second pixel electrode, a second common electrode, a second light emission layer, a second hole control layer, and a second electron control layer disposed between the second light emission layer and the second common electrode and connected to the first electron control layer, wherein the second common electrode is connected to the first common electrode, wherein the second light emission layer is disposed between the second pixel electrode and the second common electrode, wherein the second hole control layer is disposed between the second light emission layer and the second pixel electrode and connected to the first hole control layer; and a third pixel generating light of a third color different from the first color and the second color and comprising a third pixel electrode, a third common electrode, a third light emission layer, a third hole control layer, and a third electron control layer disposed between the third light emission layer and the third common electrode, wherein the third light emission layer is disposed between the third pixel electrode and the third common electrode, wherein the third hole control layer is disposed between the third light emission layer and the third pixel electrode, and wherein at least one of the third common electrode, the third hole control layer, and the third electron control layer is separated from the first pixel and the second pixel, wherein the first pixel and the second pixel are provided in a plurality such that the first pixels and the second pixels are arranged alternately along a first direction to form a first pixel group, and the third pixel is provided in a plurality such that the third pixels are arranged along the first direction to form a second pixel group, wherein the second pixel group is spaced apart from the first pixel group in a second direction intersecting the first direction, and the third pixel is spaced apart from the first pixel or the second pixel in a third direction intersecting the first direction and the second direction.

13. The display device of claim 12, wherein the third hole control layers of the third pixels of the second pixel group are connected to each other, the third electron control layers of the third pixels of the second pixel group are connected to each other, and the third common electrodes of the third pixels of the second pixel group are connected to each other.

14. The display device of claim 13, wherein the first hole control layers of the first pixels of the first pixel group and the second hole control layers of the second pixels of the first pixel group are connected to each other,
the first electron control layers of the first pixels of the first pixel group and the second electron control layers of the second pixels of the first pixel group are connected to each other, and
the first common electrodes of the first pixels of the first pixel group and the second common electrodes of the second pixels of the first pixel group are connected to each other.

15. The display device of claim 12, wherein
each of the first pixel group and the second pixel group is provided in plural,
the first pixel groups and the second pixel groups are alternately arranged along the second direction,
the first hole control layers of the first pixels of the first pixel groups and the second ole control layers of the second pixels of the first pixel groups are connected to each other,
the first electron control layers of the first pixels of the first pixel groups and the second electron control layers of the second pixels of the first pixel groups are connected to each other, and
the first common electrodes of the first pixels of the first pixel groups and the second common electrodes of the second pixels of the first pixel groups are connected to each other.

16. The display device of claim 12, wherein each of the first pixel group and the second pixel group is provided in plural, and the first pixel groups and the second pixel groups are alternately arranged along the second direction,
wherein the first hole control layer of the first pixel of the n-th first pixel group among the first pixel groups, the second hole control layer of the second pixel of the n-th first pixel group, the first hole control layer of the first pixel of the (n+1)th first pixel group among the first pixel groups, and the second hole control layer of the second pixels of the (n+1)th first pixel group are connected to each other, wherein n is a natural number.

17. The display device of claim 12, wherein the third common electrode of the second pixel group is spaced apart from the first and second common electrodes of the first pixel group, the third hole control layer of the second pixel group is spaced apart from the first and second hole control layers of the first pixel group, or the third electron control layer of the second pixel group is spaced apart from the first and second electron control layers of the first pixel group.

18. A display device comprising:
a first pixel configured to provide red light;
a second pixel configured to provide blue light; and
a third pixel configured to provide green light,
wherein each of the first pixel, the second pixel, and the third pixel comprises:
a pixel electrode;
common electrode disposed on the pixel electrode;
a light emission layer disposed between the pixel electrode and the common electrode;
a first auxiliary layer disposed between the pixel electrode and the light emission layer;
a second auxiliary layer disposed between the light emission layer and the common electrode; and
an insulating layer including a plurality of opening parts forming a first pixel light emission area of the first pixel, a second pixel light emission area of the second pixel, and a third pixel light emission area of the third pixel,
wherein an entire shape of the insulating layer between the first pixel light emission area and the second pixel light emission area has a different number of sides and/or a different size from that of an entire shape of the insulating layer between the second pixel light emission area and the third pixel light emission area,
wherein the first auxiliary layer of the first pixel and the first auxiliary layer of the second pixel have an integrated shape,
the second auxiliary layer of the first pixel and the second auxiliary layer of the second pixel have an integrated shape,
the common electrode of the first pixel and the common electrode of the second pixel have an integrated shape, and
at least one of the first auxiliary layer, the second auxiliary layer, and the common electrode of the third pixel is separated from a corresponding one of the first auxiliary layer, the second auxiliary layer, or the common electrode of the first and second pixels.

19. The display device of claim 18, wherein the first auxiliary layer of the third pixel is separated from the first auxiliary layer of the first pixel and the first auxiliary layer of the second pixel,
the second auxiliary layer of the third pixel is connected to the second auxiliary layer of the first pixel and the second auxiliary layer of the second pixel, wherein the second auxiliary layer of the first, second and third pixels has an integrated shape, and
the common electrode of the third pixel is connected to the common electrode of the first pixel and the common electrode of the second pixel.

* * * * *